United States Patent [19]

Baik

[11] Patent Number: 4,973,916

[45] Date of Patent: Nov. 27, 1990

[54] OPERATIONAL AMPLIFIER DRIVEN POWER AMPLIFIER

[75] Inventor: Yun J. Baik, Lake CharlesBucheon, La.

[73] Assignee: McBaik Electronics, Ltd., Lake Charles, La.

[21] Appl. No.: 420,665

[22] Filed: Oct. 10, 1989

Related U.S. Application Data

[63] Continuation of Ser. No. 131,898, Dec. 11, 1987, abandoned.

[51] Int. Cl.[5] .............................................. H03F 3/45
[52] U.S. Cl. .................................... 330/255; 330/264
[58] Field of Search ....................... 330/255, 264, 269

[56] References Cited

U.S. PATENT DOCUMENTS

| | | | |
|---|---|---|---|
| 3,818,361 | 6/1974 | Gonda | 330/297 |
| 3,919,655 | 11/1975 | Crandall | 330/255 |
| 4,483,016 | 11/1984 | Hochstein et al. | 330/264 X |
| 4,555,672 | 11/1985 | Segal | 330/255 |

OTHER PUBLICATIONS

Machuka, "A 40W HI-FI Amplifier with VMOS Transistors for HI-FI Enthusiasts", *Funkschau*, vol. 52, No. 21, Oct. 10, 1980, pp. 330-255.

*Primary Examiner*—James B. Mullins
*Attorney, Agent, or Firm*—Pravel, Gambrell, Hewitt, Kimball & Krieger

[57] ABSTRACT

A power amplifier system measures the amount of power supplied to the voltage supply pins of an operational amplifier, and supplies a proportional amount thereof to drive power amplifiers. A comprehensive system analyzer is used to protect the circuit and the load against power excesses.

20 Claims, 5 Drawing Sheets

— 4,973,916 —

OPERATIONAL AMPLIFIER DRIVEN POWER AMPLIFIER

This is a continuation of Ser. No. 07/131,898, filed on 12/11/89 and now abandoned.

BACKGROUND OF THE INVENTION

1. Field of the Invention

The present invention relates to power amplifiers, and more particularly to operational amplifier driven power amplifiers.

2. General Background

Operational amplifiers, (OP AMPS), are used today as power amplifier drivers. Typically, the output of the op amp is used to drive the power amplifier.

SUMMARY OF THE PRESENT INVENTION

The present invention uses the voltage supply pins of an operational amplifier to drive power amplifiers. A comprehensive system analyzer is used to protect the circuit and the load against power excesses and reveals the problems on an indicator means.

BRIEF DESCRIPTION OF THE DRAWINGS

For a further understanding of the nature and objects of the present invention, reference should be had to the following detailed description, taken in conjunction with the accompanying drawings, in which like parts are given like reference numerals, and wherein.

DETAILED DESCRIPTION OF THE PREFERRED EMBODIMENT

Figure 1:
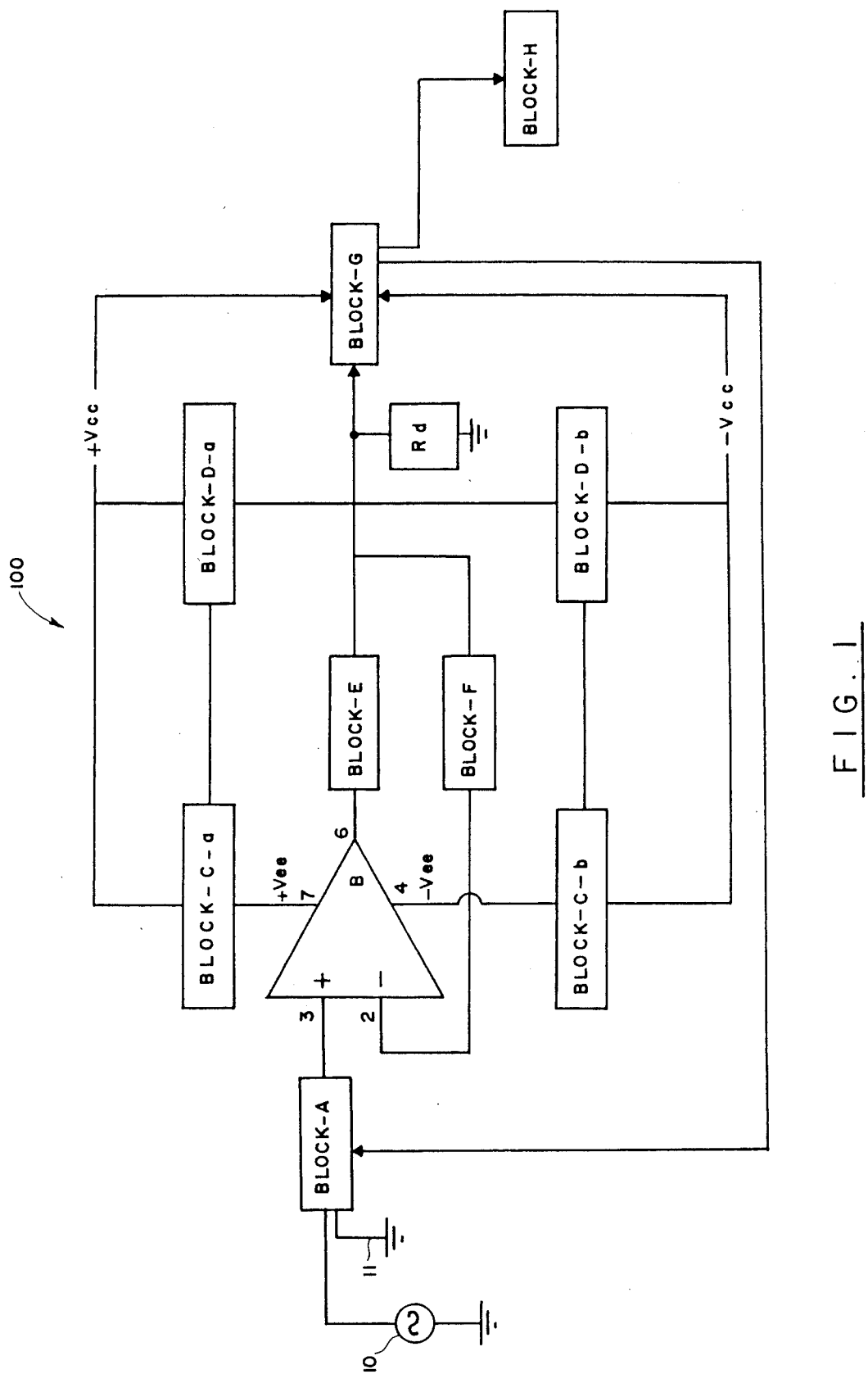
FIG. 1 is a block diagram of the preferred embodiment of the present invention.

FIG. 1 is a block diagram of the present invention, power amplifier 100. Block A is a switch to connect the non-inverting input pin 3 of operational amplifier (OP AMP) B to signal source 10 or non-signal source 11 (ground). It is controlled by block G, as will be described further.

OP AMP B has an inverting input, non-inverting input, and output and uses two power supplies (+Vee and −Vee). It has a non-inverting input pin 3 to, an inverting input pin 2, a first voltage supply pin 4, an output pin 6, and a second voltage supply pin 7.

Blocks C-a and C-b supply current and voltage to OP AMP B, and keep the voltage within the maximum magnitudes of power supply voltages (+Vee, +Vee). Blocks C-a and C-b drive a constant ratio of current or voltage by supplying current of OP AMP B to blocks D-a and D-b. Blocks C-a and C-b may be termed "measuring and driving means" or "voltage level shifter circuit means."

Blocks D-a and D-b are power amplifiers and serve to supply appreciable power to load Rd.

Block E is a feedback network between the output of OP AMP B and load Rd.

Block F is a feedback network between the inverting input of OP AMP B and load Rd.

Figure 7:
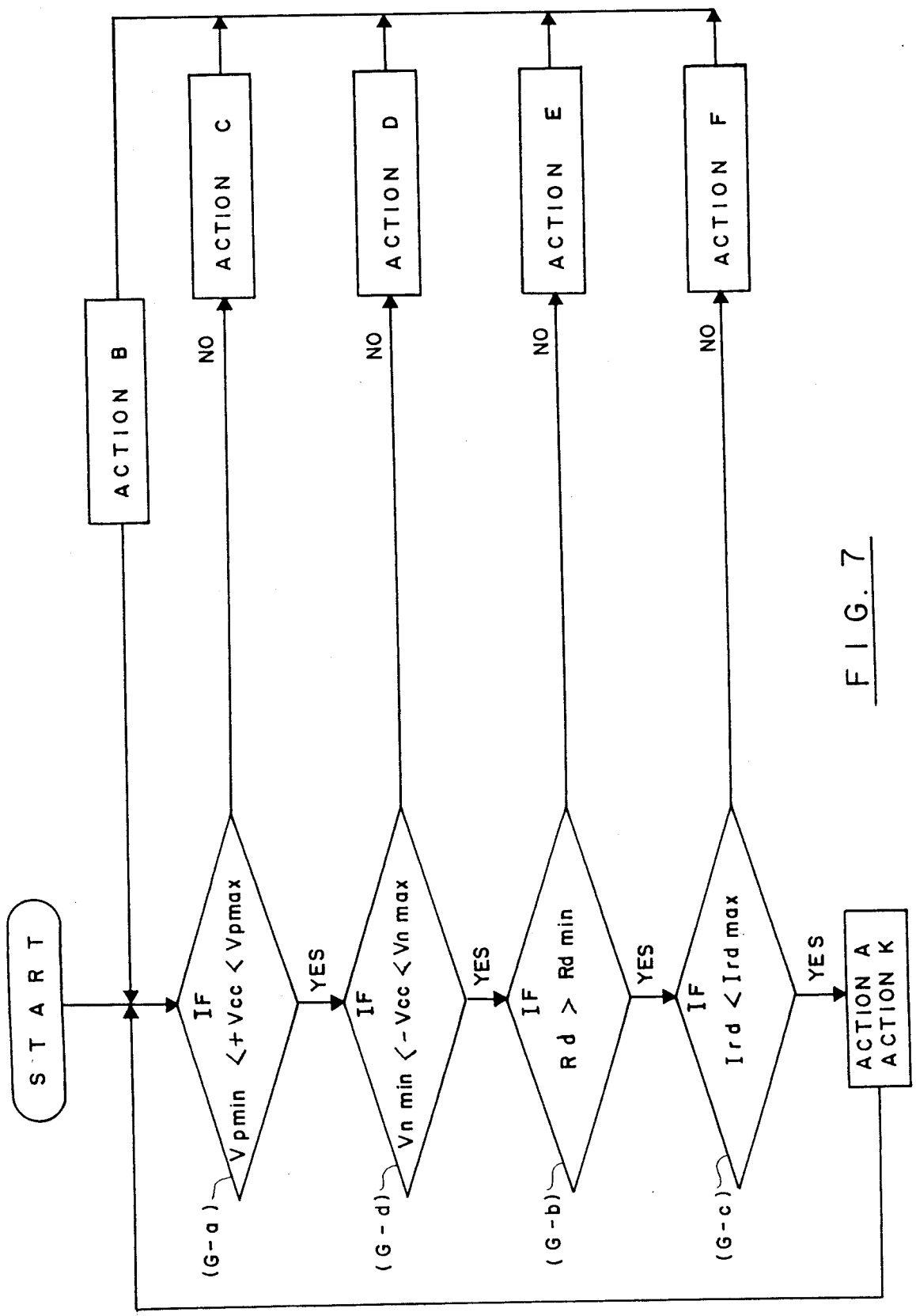
FIG. 7 is a flow chart of block G.

Block G is a system analyzer to controls, Block A and Block H, determined by +Vcc, −Vcc, load Rd and current to load Rd. The flow chart for Block G is shown in FIG. 7.

Block H contains system indicators controlled by Block G.

Load Rd may comprise, for example, a speaker.

Figure 2:
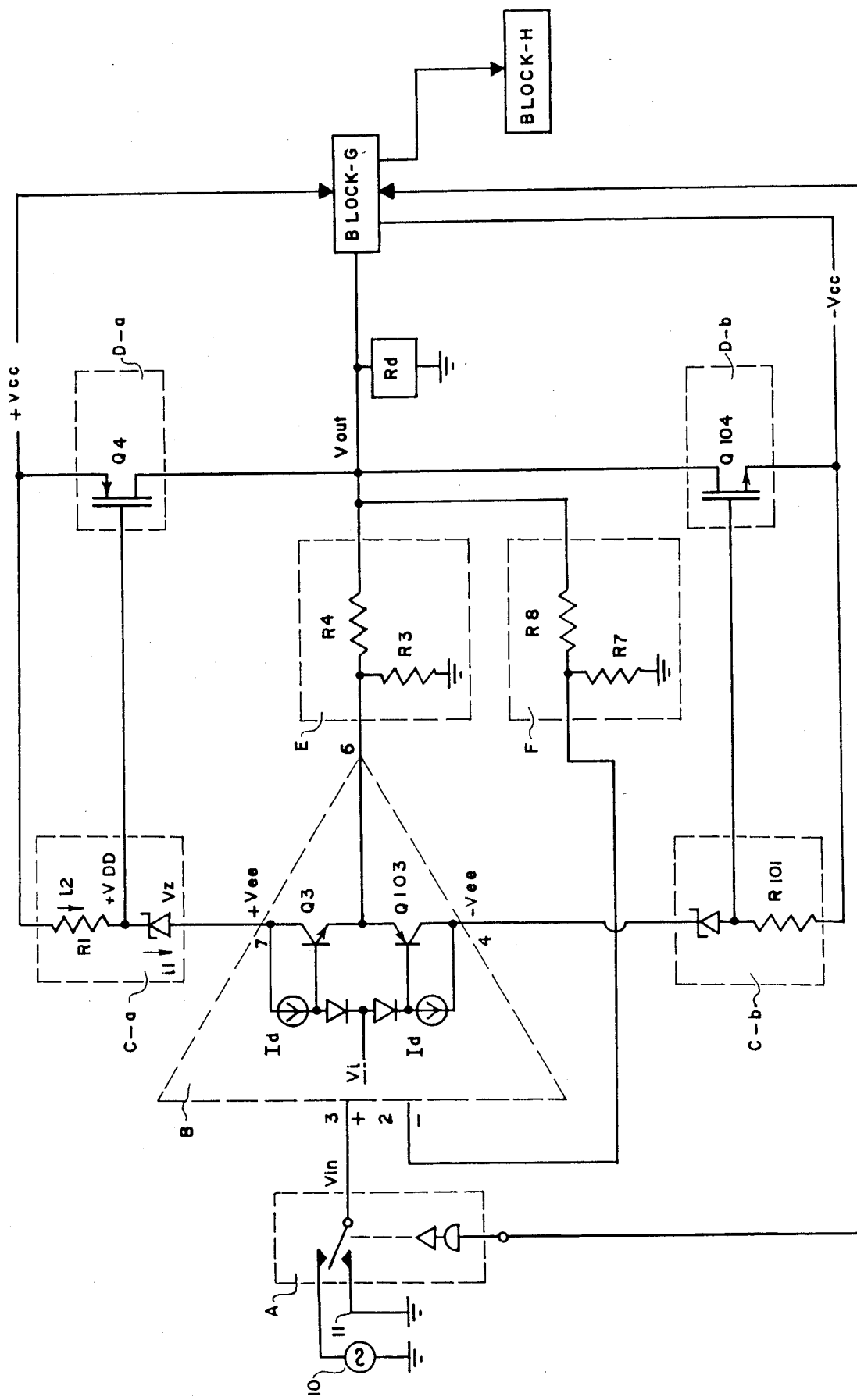
FIG. 2 is a mixed circuit/block diagram of the preferred embodiment of the present invention.

Referring now to FIG. 2, where some circuitry is shown, Block A contains a switch to connect the non-inverting input pin 3 of OP AMP B to either signal source 10 or ground 11.

Only the general schematic of the output section of OP AMP B is shown in FIG. 2. The general input stage of OP AMP B is a differential amplifier circuit. OP AMP B may comprise, for example, an LF351 or a TL071.

Load resistors R-1 and R-101 generate the necessary bias and drive voltages that blocks D-a and D-b require. Voltage +VDD will be determined by i2 and R1 as follows:

$$i_2 = C_1 \times i_1 \quad \text{(where } C_1 \text{ is a constant)}$$
$$V_{cc} = VDD + i_2 \times R_1$$
$$V_{cc} - VDD = i_2 \times R_1 = C_1 \times i_1 \times R_1$$
$$V_z = VDD - V_{ee}.$$

In FIG. 2, Block D-a comprises a P-channel MOSFET, and Block D-b comprises an N-channel MOSFET.

In FIG. 2, resistors R3 and R4 are shown in Block E, which is a voltage feedback circuit. Block E creates additional gain which improves the band-width, slew rate, reduces distortion of the amplifier, and improves the gain-band-width product. Compensation could be added in Block E for phase characteristics.

Figure 5:
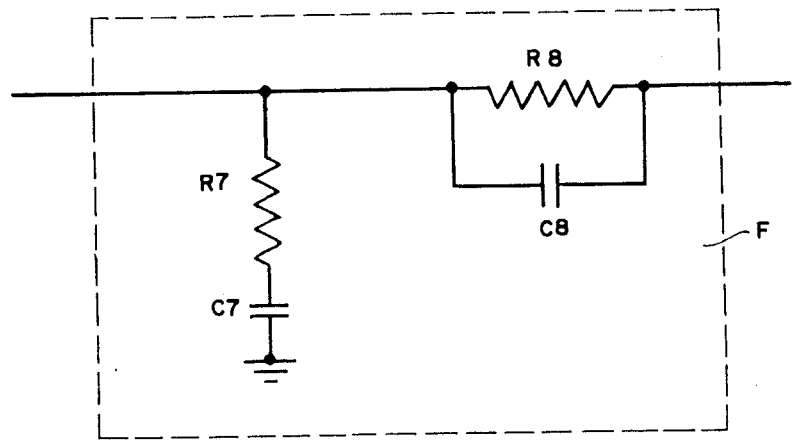
FIG. 5 shows an alternative embodiment of block F.

Block F is a negative feedback circuit which can consist simply of resistors R7, and R8, as shown in FIGURE 2. This negative feedback circuit controls the gain (vout/vin). Compensation could be added for overall gain and phase characteristics, such as shown in FIG. 5 (capacitors C-7 and C-8).

Figure 3:
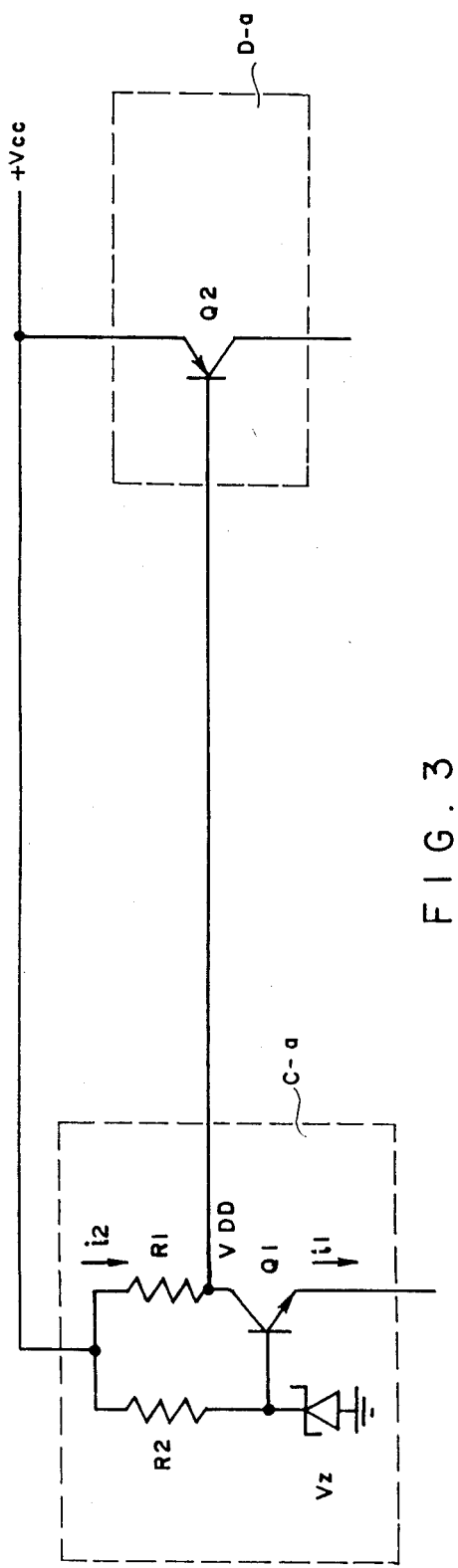
FIG. 3 shows blocks C-a and D-a of a second embodiment of the present invention.
Figure 4:
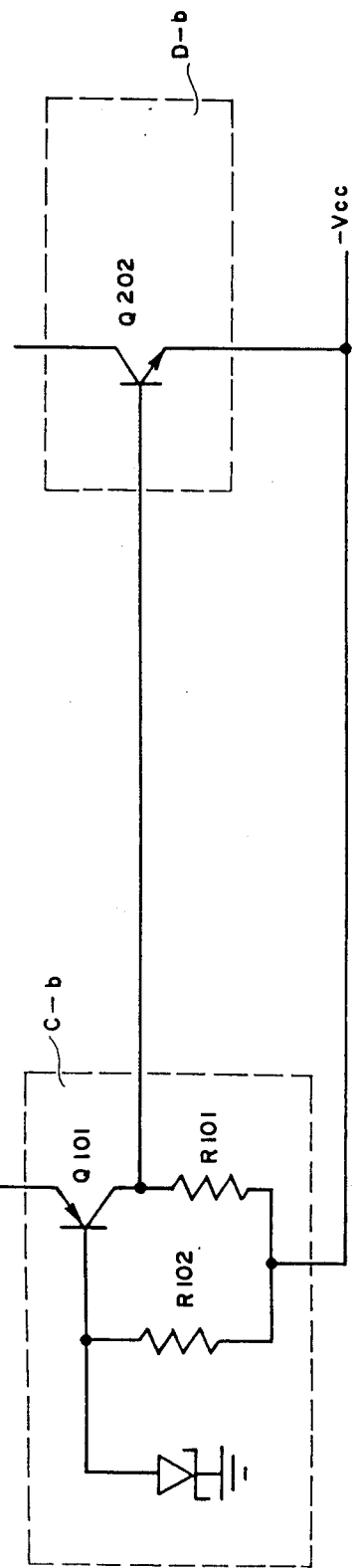
FIG. 4 shows blocks C-b and D-b of the second embodiment of the present invention.

FIGS. 3 and 4 show blocks C-a, C-b, D-a, and D-b of a second embodiment of the present invention.

Transistor Q2 may comprise a PNP bipolar transistor or a Darlington transistor. Transistor Q202 may comprise an NPN bipolar transistor or a Darlington transistor. In FIGS. 3 and 4, R1 and R101 are drivers for Blocks D-a and D-b. R2 and R102 supply voltage to the base of transistors Q1 and Q101. Voltage $V_z = V_{ee} + 0.7$ V. The relationships between i1 and i2 and Vcc and VDD are the same as with Blocks C-a and C-b shown in FIG. 2.

Figure 6:
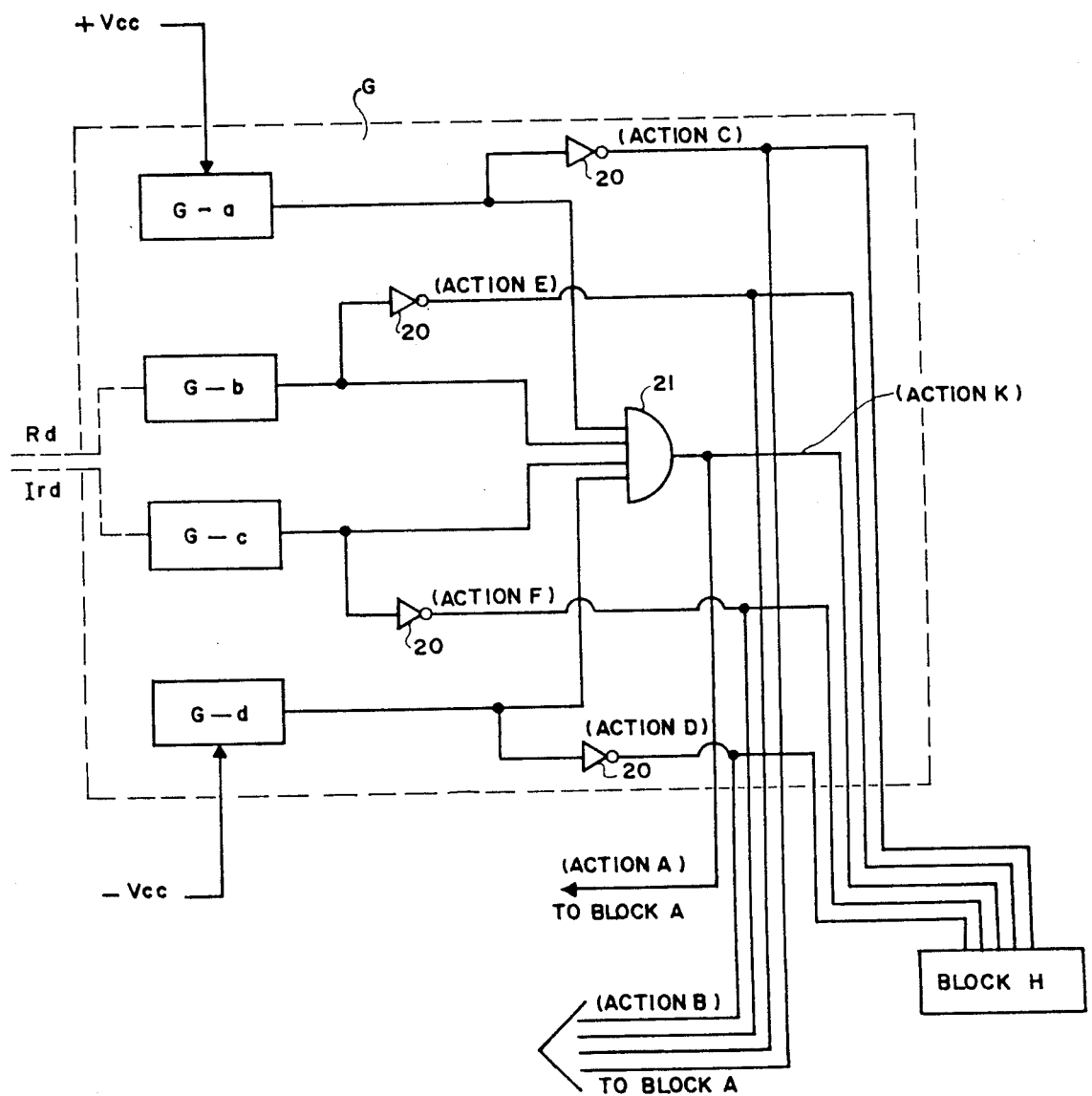
FIG. 6 is a circuit/block diagram of block G.

FIG. 6 is a circuit/block diagram of Block G. In FIG. 6, Blocks G-a, G-b, G-c, and G-d are shown, along with logic inverters 20, and logic AND gate 21. Blocks G-a, G-b, G-c, and G-d comprise comparative circuits. A flow chart showing the actions of these blocks is shown in FIGURE 7. The legend for FIG. 7 is set forth below.

| LEGEND FOR FIG. 7 | |
| --- | --- |
| +Vcc: | POSITIVE POWER SUPPLY VOLTAGE |
| −Vcc: | NEGATIVE POWER SUPPLY VOLTAGE |
| Vpmin: | MINIMUM VOLTAGE OF +Vcc TO OPERATE THE CIRCUITS PROPERLY |

| | |
|---|---|
| Vpmax: | MAXIMUM VOLTAGE OF +Vcc TO OPERATE THE CIRCUITS PROPERLY |
| Vnmin: | MINIMUM VOLTAGE OF −Vcc TO OPERATE THE CIRCUITS PROPERLY |
| Vnmax: | MAXIMUM VOLTAGE OF −Vcc TO OPERATE THE CIRCUITS PROPERLY |
| Rdmin: | MINIMUM LOAD IMPEDANCE TO OPERATE THE CIRCUITS PROPERLY |
| Ird: | CURRENT TO A LOAD Rd |
| Irdmax: | MAXIMUM CURRENT OF Ird TO OPERATE THE CIRCUITS PROPERLY |
| | DESCRIPTION OF ACTIONS: |
| ACTION A: | CONNECT INPUT PIN 3 OF OP AMP-B TO SIGNAL SOURCE 10 |
| ACTION B: | CONNECT INPUT PIN 3 OF OP AMP-B TO NON-SIGNAL SOURCE 11 |
| ACTION C: | INDICATE "+Vcc FAIL" THROUGH BLOCK H |
| ACTION D: | INDICATE "−Vcc FAIL" THROUGH BLOCK H |
| ACTION E: | INDICATE "LOAD FAIL" THROUGH BLOCK H |
| ACTION F: | INDICATE "TOO HIGH LOAD CURRENT" THROUGH BLOCK H |
| ACTION K: | INDICATE "ALL RIGHT" THROUGH BLOCK H |

Because many varying and different embodiments may be made within the scope of the inventive concept herein taught, and because many modifications may be made in the embodiments herein detailed in accordance with the descriptive requirement of the law, it is to be understood that the details herein are to be interpreted as illustrative and not in a limiting sense.

I claim:

1. An amplifier circuit comprising:
   (a) an output means for connecting the amplifier circuit to a load;
   (b) an operational amplifier having an input means, an output means, and voltage supply pin means;
   (c) MOSFETs having input means and output means;
   (d) measuring and driving means, comprising Zener diode means, coupled between the voltage supply pin means of the operational amplifier and the input means of the MOSFETs for measuring power supplied to the operational amplifier and supplying a proportional amount thereof to the input means of the MOSFETs; and
   (e) an electrical connection between the output means of the operational amplifier, the output means of the MOSFETs, and the output means of the amplifier circuit.

2. The amplifier circuit of claim 1, wherein:
   (i) the voltage supply pin means comprises a positive voltage supply pin means and a negative voltage supply pin means;
   (ii) the MOSFETs include a first MOSFET and a second MOSFET; and
   (iii) the measuring and driving means comprises:
      (1) a first Zener diode electrically connected in series between the gate of the first MOSFET and the positive voltage supply pin means; and
      (2) a second Zener diode electrically connected in series between the gate of a second MOSFET and the negative voltage supply pin means.

3. The amplifier circuit of claim 1, wherein:
   the input means of the operational amplifier comprises positive input means and negative input means and the amplifier circuit further comprises:
   (f) a feedback circuit electrically connected between the output means of the amplifier circuit and the negative input means of the operational amplifier.

4. The amplifier circuit of claim 3, further
   (g) a feedback circuit between the output means of the operational amplifier and the output means of the amplifier circuit.

5. The amplifier circuit of claim 4, wherein the feedback circuits comprise resistors.

6. The amplifier circuit of claim 1, wherein the Zener diodes means comprises Zener diodes.

7. An amplifier circuit comprising:
   (a) an output means for connecting the amplifier circuit to a load;
   (b) an operational amplifier having a positive input means and a negative input means, an output means, and voltage supply pin means;
   (c) power amplifiers, comprising MOSFETs, having input means and output means;
   (d) measuring and driving means coupled between the voltage supply pin means of the operational amplifier and the input means of the power amplifiers for measuring power supplied to the operational amplifier and supplying a proportional amount thereof to the input means of the power amplifiers;
   (e) an electrical connection between the output means of the power amplifiers, the output means of the operational amplifier, and the output means of the amplifier circuit; and
   (f) a feedback circuit electrically connected between the output means of the amplifier circuit and the negative input means of the operational amplifier.

8. The amplifier circuit of claim 7 further comprising:
   (g) a feedback circuit between the output means of the operational amplifier and the output means of the amplifier circuit.

9. The amplifier circuit of claim 8, wherein the feedback circuits comprises resistors.

10. The amplifier circuit of claim 7, wherein:
    (i) the voltage supply pin means comprises a positive voltage supply pin means and a negative voltage supply pin means;
    (ii) the MOSFETs include a first MOSFET and a second MOSFET; and
    (iii) the measuring and driving means comprises:
       (1) a first Zener diode electrically connected in series between the gate of the first MOSFET and the positive voltage supply pin means; and
       (2) a second Zener diode electrically connected in series between the gate of a second MOSFET and the negative voltage supply pin means.

11. The amplifier circuit of claim 10, further comprising:
    (g) a feedback circuit between the output means of the operational amplifier and the output means of the amplifier circuit.

12. The amplifier circuit of claim 11, wherein the feedback circuits comprise resistors.

13. The amplifier circuit of claim 7, wherein:
    the measuring and driving means comprise Zener diodes.

14. The amplifier circuit of claim 13, further comprising:
    (g) a feedback circuit between the output means of the operational amplifier and the output means of the amplifier circuit.

15. The amplifier circuit of claim 14, wherein the feedback circuits comprise resistors.

16. An amplifier circuit comprising:
 (a) an output means for connecting the amplifier circuit to a load;
 (b) an operational amplifier having an input means, an output means, and voltage supply pin means;
 (c) MOSFETs having input means and output means; and
 (d) voltage level shifter circuit means coupled between the voltage supply pin means of the operational amplifier and the input means of the MOSFETs for measuring power supplied to the operational amplifier and supplying a proportional amount thereof to the input means of the MOSFETs.

17. The amplifier circuit of claim 16, further comprising:
 an electrical connection between the output means of the operational amplifier, the output means of the MOSFETs, and the output means of the amplifier circuit.

18. The amplifier circuit of claim 16, wherein:
 (i) the voltage supply pin means comprises a positive voltage supply pin means and a negative voltage supply pin means;
 (ii) the MOSFETs include a first MOSFET and a second MOSFET; and
 (iii) the voltage level shifter circuit means comprises:
  (1) a first Zener diode electrically connected in series between the gate of the first MOSFET and the positive voltage supply pin means; and
  (1) a second Zener diode electrically connected in series between the gate of a second MOSFET and the negative voltage supply pin means.

19. The amplifier circuit of claim 16, wherein:
 the input means of the operational amplifier comprises positive input means and negative input means and the amplifier circuit further comprises:
 (f) a feedback circuit electrically connected between the output means of the amplifier circuit and the negative input means of the operational amplifier.

20. The amplifier circuit of claim 19, further
 (g) a feedback circuit between the output means of the operational amplifier and the output means of the amplifier circuit.

* * * * *